US011269026B2

(12) United States Patent
Wood et al.

(10) Patent No.: US 11,269,026 B2
(45) Date of Patent: Mar. 8, 2022

(54) QUANTUM SPIN MAGNETOMETER

(71) Applicant: The University of Melbourne, Melbourne (AU)

(72) Inventors: Alexander Wood, Melbourne (AU); Andrew Martin, Melbourne (AU); Alastair Stacey, Melbourne (AU); Lloyd Hollenberg, Melbourne (AU)

(73) Assignee: The University of Melbourne, Victoria (AU)

( * ) Notice: Subject to any disclaimer, the term of this patent is extended or adjusted under 35 U.S.C. 154(b) by 119 days.

(21) Appl. No.: 16/533,167

(22) Filed: Aug. 6, 2019

(65) Prior Publication Data
US 2020/0049776 A1 Feb. 13, 2020

(30) Foreign Application Priority Data

Aug. 7, 2018 (AU) .............................. 2018214017

(51) Int. Cl.
*G01R 33/26* (2006.01)
*G01R 33/12* (2006.01)
*G01R 33/02* (2006.01)

(52) U.S. Cl.
CPC ............. *G01R 33/26* (2013.01); *G01R 33/02* (2013.01); *G01R 33/1284* (2013.01)

(58) Field of Classification Search
CPC .... G01R 33/26; G01R 33/1284; G01R 33/02; G01R 33/307; G01R 33/24; B82Y 15/00; G01N 24/08
USPC ........................................................ 324/252
See application file for complete search history.

(56) References Cited

U.S. PATENT DOCUMENTS

| 4,489,274 A | 12/1984 | Berlincourt |
| 4,600,885 A | 7/1986 | Koo et al. |
| 4,613,949 A * | 9/1986 | Glover ................. G01R 33/446 324/307 |

(Continued)

FOREIGN PATENT DOCUMENTS

WO 2010149775 A1 12/2010

OTHER PUBLICATIONS

Acosta, V.M. et al., "Broadband magnetometry by infrared absorption detection of nitrogen-vacancy ensembles in diamond," Applied Physics Letters, vol. 97 (174104) 4 pages (2010).

(Continued)

*Primary Examiner* — Christopher P McAndrew
(74) *Attorney, Agent, or Firm* — Nelson Mullins Riley & Scarborough LLP

(57) ABSTRACT

This disclosure relates to a magnetometer for measuring a magnetic field. The magnetometer comprises a solid state quantum system with at least two quantum spin states. A control signal generator sets the quantum system into a quantum state that accumulates a phase over time depending on the magnetic field. A detector measures a signal from the quantum system indicative of the accumulated phase at a measurement time after the setting of the quantum state. A processor determines a magnetic field measurement based on the signal measured by the detector. Importantly, the quantum system is mounted on a rotator that is configured to rotate the quantum system about a rotation axis that defines an angle with the direction of the magnetic field and at a rotation rate that modulates the magnetic field over the measurement time.

20 Claims, 7 Drawing Sheets

(56) References Cited

U.S. PATENT DOCUMENTS

| | | | |
|---|---|---|---|
| 4,864,237 | A | 9/1989 | Hoenig |
| 6,501,268 | B1 | 12/2002 | Edelstein et al. |
| 7,508,202 | B2 | 3/2009 | Tilbrook |
| 7,898,247 | B2 * | 3/2011 | Edelstein ........... G01R 33/0029 324/244 |
| 8,222,898 | B1 | 7/2012 | Edelstein |
| 8,947,080 | B2 | 2/2015 | Lukin et al. |
| 9,851,418 | B2 | 12/2017 | Wolf et al. |
| 2003/0208120 | A1* | 11/2003 | Thomas ............. G01R 33/4633 600/410 |
| 2010/0231211 | A1* | 9/2010 | Edelstein ............... G01D 15/00 324/244 |
| 2010/0315079 | A1* | 12/2010 | Lukin .................. G01R 33/032 324/244.1 |
| 2013/0029333 | A1* | 1/2013 | Son .................. C12Q 2563/157 435/6.11 |

OTHER PUBLICATIONS

Acosta, V.M. et al., "Temperature Dependence of the Nitrogen-Vacancy Magnetic Resonance in Diamond," Phys. Rev. Lett., vol. 104 (070801) 4 pages (2010).

Ajoy, A., et al., "DC Magnetometry at the T2 Limit," arXiv: 1611.04691, 15 pages (2016).

Balasubramanian, G. et al., "Ultralong spin coherence time in isotopically engineered diamond," Nat Mater, vol. 8: 383-387(2009).

Bauch, E. et al.,"Ultralong dephasing times in solid-state spin ensembles via quantum control," Phys. Rev., vol. 8 (031025) 28 pages (2018).

Braginski, A.I. et al., "The Squid Handbook: vol. I Fundamentals and Technology of SQUIDs and SQUID Systems," Wiley-VCH Verlag GmbH, 1st ed., vol. 1: 414 pages (2004).

Budker, D., et al., "Optical magnetometry," Cambridge University Press, 17 pages (2013).

Childress, L. et al., "Coherent Dynamics of Coupled Electron and Nuclear Spin Qubits in Diamond," Science, vol. 314: 281-285 (2006).

Clevenson, H. et al., "Broadband magnetometry and temperature sensing with a light-trapping diamond waveguide," Nature Physics, vol. 11:393-398 (2015).

De Lange, G. et al., "Controlling the quantum dynamics of a mesoscopic spin bath in diamond," Scientific Reports, vol. 2, 382 (2012).

Degen, C. et al., "Quantum sensing," Reviews of Modern Physics, vol. 89: 035002-1 to 035002-39 (2017).

Doherty, M. W., et al., "The nitrogen-vacancy colour centre in diamond," Physics Reports, vol. 528: 1-45 (2013).

Doherty, M.W. et al., "Measuring the defect structure orientation of a single NV? centre in diamond," New J. Phys., vol. 16, 063067: 21 pages (2014).

Dolde, F. et al., "Electric-field sensing using single diamond spins," Nat Phys., vol. 7: 459-463 (2011).

Dreau, A. et al., "Avoiding power broadening in optically detected magnetic resonance of single NV defects for enhanced dc magnetic field sensitivity," Phys. Rev. B., vol. 84, (195204) 8 pages (2011).

Fang, K. et al., "High-Sensitivity Magnetometry Based on Quantum Beats in Diamond Nitrogen-Vacancy Centers," Phys. Rev. Lett., vol. 110: 130802.1-130802-5 (2013).

Hahn, E. L., "Spin Echos," Phys. Rev, vol. 80(4): 580-594 (22 pages supplemental data) (1950).

Hall, L. T., et al., "Analytic solutions to the central-spin problem for nitrogen-vacancy centers in diamond," Physical Review B., vol. 90: 075201.1-075201.30 (2014).

Hanson, R. et al., "Coherent Dynamics of a Single Spin Interacting with an Adjustable Spin Bath," Science, vol. 320: 352-355 (2008).

Hong, S., et al., "Coherent, Mechanical Control of a Single Electronic Spin," Nano Lett., vol. 12: 3920-3924 (2012).

Hämäläinen, M. et al., :"Magnetoencephalography theory, instrumentation, and applications to noninvasive studies of the working human brain," Rev. Mod. Phys., vol. 65 (Issue 2): 94 pages (1993).

Jeske, J. et al., "Laser threshold magnetometry," New J. Phys., vol. 18 (013015) 9 pages (2016).

Kennedy, T.A. et al., "Long coherence times at 300 K for nitrogen-vacancy center spins in diamond grown by chemical vapor deposition," J. Appl. Phys. Lett., vol. 83(20):, 4190-4192 (2003).

Le Sage, D. et al., "Optical magnetic imaging of living cells," Nature, vol. 496: 6 pages (2013).

Ledbetter, M.P. et al., "Gyroscopes based on nitrogen-vacancy centers in diamond," Phys. Rev. A, vol. 86: 052116.1-052116-5 (2012).

Maclaurin, D. et al., "Measurable Quantum Geometric Phase from a Rotating Single Spin," Phys. Rev. Lett. 108, be 240403-1 to 240403-5 (2012).

McGuinness, L-P., et al., "Quantum measurement and orientation tracking of fluorescent nanodiamonds inside living cells," Nature Nanotechnology, vol. 6: 358-363(2011).

Michl, J. et al., "Perfect alignment and preferential orientation of nitrogen-vacancy centers during chemical vapor deposition diamond growth on (111) surfaces," Appl. Phys. Lett., vol. 104:102407.1-102407.5 (2014).

Pham, L.M. et al., "Enhanced metrology using preferential orientation of nitrogen-vacancy centers in diamond," Physical Review B., vol. 86 (R):121202.1-121202.1 (2012).

Rondin, L. et al., "Magnetometry with nitrogen-vacancy defects in diamond," Rep. Prog. Phys., vol. 77 (056503) 26 pages (2014).

Schmidt, P. et al., "GETMAG—a SQUID magnetic tensor gradiometer for mineral and oil exploration," Explor. Geophys., vol. 35: 297-305 (2004).

Simpson, D.A., et al., "Magneto-optical imaging of thin magnetic films using spins in diamond," Scientific Reports, vol. 6(22797): 8 pages (2016).

Stanwix, P.L., "Coherence of nitrogen-vacancy electronic spin ensembles in diamond," Physical Review B, vol. 82, 201201.1-201201.4 (2010).

Steinert, S. et al., "High sensitivity magnetic imaging using an array of spins in diamond," Review of Scientific Instruments, vol. 81, 043705.1-43705.5 (2010).

Taylor, J.M. et al., "High-sensitivity diamond magnetometer with nanoscale resolution," Nat Phys., vol. 4: 810-817 (2008).

Tetienne, J-P. et al.,"Nanoscale imaging and control of domain-wall hopping with a nitrogen-vacancy center microscope," Science, vol. 344(6190):1366-1369 (2014).

Tetienne, J-P., et al., "Quantum imaging of current flow in graphene," Science Advances, vol. 3 (e1602429), 6 pages (2017).

Vandersypen, L.M.K. et al., "NMR techniques for quantum control and computation," Rev. Mod. Phys., vol. 76, 1037-1069 (2004).

Vlasov, I.I. et al., "Relative Abundance of Substitutional Nitrogen: Relative Abundance of Single and Vacancy-bonded Substitutional Nitrogen in CVD Diamond," Phys. Stat. Sol. (a) vol. 181: 83-90 (2000).

Wickenbrock, A. et al., "Microwave-free magnetometry with nitrogen-vacancy centers in diamond," Appl. Phys. Lett., vol. 109 (053505) 5 pages (2016).

Wolf, T. et al., "Subpicotesla Diamond Magnetometry," Phys. Rev., X 5 (041001) 10 pages (2015).

Wood, A.A. et al., "Quantum measurement of a rapidly rotating spin qubit in diamond," Nature Physics, Sci. Adv., vol. 4 (eaar7691): 6 pages (2018).

Wood, A.A. et al., "T2-limited sensing of static magnetic fields via fast rotation of quantum spins," Physical Review B, id No. arXiv:1802.03845, 9 pages (2018).

Zhao, N. et al., "Decoherence and dynamical decoupling control of nitrogen vacancy center electron spins in nuclear spin baths," Physical Review B., vol. 85:115303-3-115303-18 (2012).

Wood, A., et al. "Magnetic pseudo-fields in a rotating electron-nuclear spin system" arXiv:1707.03481v1 [quant-ph]: 12 pages (Jul. 2017).

Wood, A. et al., "Magnetic pseudo-fields in a rotating electron-nuclear spin system," Letters, Nature Physics, vol. 13: 1070-1074 (Nov. 2017).

(56) References Cited

OTHER PUBLICATIONS

Wood, A., et al. "Magnetic pseudo-fields in a rotating electron-nuclear spin system" Nature Physics, Supplementary information, 10 pages (May 2017).

* cited by examiner

QUANTUM SPIN MAGNETOMETER

CLAIM OF PRIORITY

This application claims priority to Australian Patent Application No. 2018214017 filed Aug. 7, 2018, which is incorporated herein by reference in its entirety.

TECHNICAL FIELD

This disclosure relates to magnetometers based on quantum systems with quantum spin states.

BACKGROUND

Accurate magnetometers have a broad range of applications, including medical applications like magnetoencephalography, mining and biological sensing. One way of measuring weak magnetic fields is related to Nuclear Magnetic Resonance (NMR). In particular, quantum systems can be used to measure weak magnetic fields because the magnetic field changes the energy levels in the quantum system due to the Zeeman effect. In turn, this changes the precession rate of the system and therefore the phase that is accumulated over time by the quantum system.

FIG. 1 illustrates a simplified visualisation 100 in the form of a Bloch sphere 101 where a quantum system, such as a qubit, is brought into the |b> state 102 and then into a superposition state 103 by a $\pi/2$ rotation about rotation axis 104. From there, the quantum system precesses along the equator as indicated by arrow 105. After a measurement time the quantum state can then be rotated again by another $\pi/2$ rotation about rotation axis 104. Depending on the rate of precession, the second rotation will rotate the system into the top half of the sphere (more likely to measure |a> state 106) or into the bottom half of the sphere (more likely to measure |b> state 102.

If an additional magnetic field is applied, the precession rate changes (depending on the field direction and strength). In other words, the vector will precess in the bloch sphere plane by an amount proportional to the magnetic field to be measured. As a result, the quantum system will arrive at a state that is different to the state shown in FIG. 1. This means, the quantum state has accumulated a phase. If the quantum state is then rotated by another $\pi/2$ rotation about the rotation axis 104, it will land at a different point than in FIG. 1. As a result, there is now a different probability that the measured quantum state will be the |b> state 102 or |a> state 106. If this process is repeated many times, the number of measurements in the |1> state indicates the magnetic field strength.

It is generally possible to wait for a longer measurement time, which may allow precession over multiple full rotations. This provides a longer time for the quantum system to accumulate a phase difference and therefore a higher sensitivity. That is, a smaller change in the magnetic field causes a larger accumulation of phase and a larger change in the number of measurements of the |1> state.

However, the limit for the measurement time of a single measurement is the decoherence time (T2) of the quantum system because once the decoherence time is reached, the phase will be corrupted by intrinsic noise to an extent that reduces the dependency of the measurements to the magnetic field. The system turns into a purely random process. In addition, when multiple measurements are integrated over time, the limit for the measurement time is further reduced by variations between the measurements leading to the dephasing time (T2*) of the system, which is generally less than the decoherence time. As a result, current systems for DC magnetometry can accumulate phase only for a relatively short measurement time (dephasing time) leading to relatively low sensitivity. It would be desirable to extend that time to a longer measurement time, such as the decoherence time of the quantum system, to increase sensitivity.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

A magnetometer for measuring a magnetic field comprises:

a solid state quantum system with at least two quantum spin states;

a control signal generator to set the quantum system into a quantum state that accumulates a phase over time depending on the magnetic field;

a detector to measure a signal from the quantum system indicative of the accumulated phase at a measurement time after the setting of the quantum state;

a processor to determine a magnetic field measurement based on the signal measured by the detector;

wherein the quantum system is mounted on a rotator that is configured to rotate the quantum system about a rotation axis that defines an angle with the direction of the magnetic field and at a rotation rate that modulates the magnetic field over the measurement time.

The magnetic field to be detected may be static or vary slowly relative to the measurement time.

The signal indicative of the accumulated phase may be indicative of the quantum system being in one of the at least two quantum spin states as a result of the accumulated phase and a readout operation.

The processor may be configured to determine the magnetic field measurement based on multiple signals over time and based on a number of occurrences of one of the at least two quantum spin states as indicated by the multiple signals over time.

The magnetic field measurement may be a relative magnetic measurement based on a relationship between both of the number of occurrences and the magnetic field.

The quantum state may be a superposition state.

The rotation rate may be based on a coherence time of the quantum system. The rotation rate may have a period that is an integer multiple of the coherence time of the quantum system. The period may be equal to the coherence time of the quantum system. The period may be the decoherence time T2 of the quantum system.

The control signal generator and the detector may be synchronised with the rotator. The control signal generator may be configured to generate pulses to control the quantum system and the pulses may be synchronised with the rotator. The rotator may trigger the generator to generate the pulses.

The pulses may be generated at a rotation angle of the rotator such that each of the pulses is generated at the same rotation angle.

An axis within the quantum system that defines at least two quantum states may be parallel to a control magnetic field generated by the control signal generator and parallel to a rotation axis of the rotator; and the rotation axis way define a non-zero angle to the magnetic field to be measured.

The quantum system way comprise a nitrogen vacancy centre in diamond. The nitrogen vacancy centre in diamond may have a crystal axis and the crystal axis may have an angle to the rotation axis which remains constant during the rotation.

The quantum system may comprise an ensemble of preferentially aligned nitrogen vacancies in diamond.

The control signal generator may comprise a light source to set the quantum system into one of at least two quantum states and a microwave source to set the quantum system into a superposition state that accumulates a phase over time and to control the state of the quantum system.

The detector may be configured to detect a fluorescent output signal emitted from the quantum system if the quantum system is in one of at least two quantum states.

A method for measuring a magnetic field comprises performing spin echo spectroscopy of a rotating solid state quantum spin system to determine a Zeeman split due to the magnetic field; and determining the magnetic field based on the determined Zeeman split.

Figure 1:
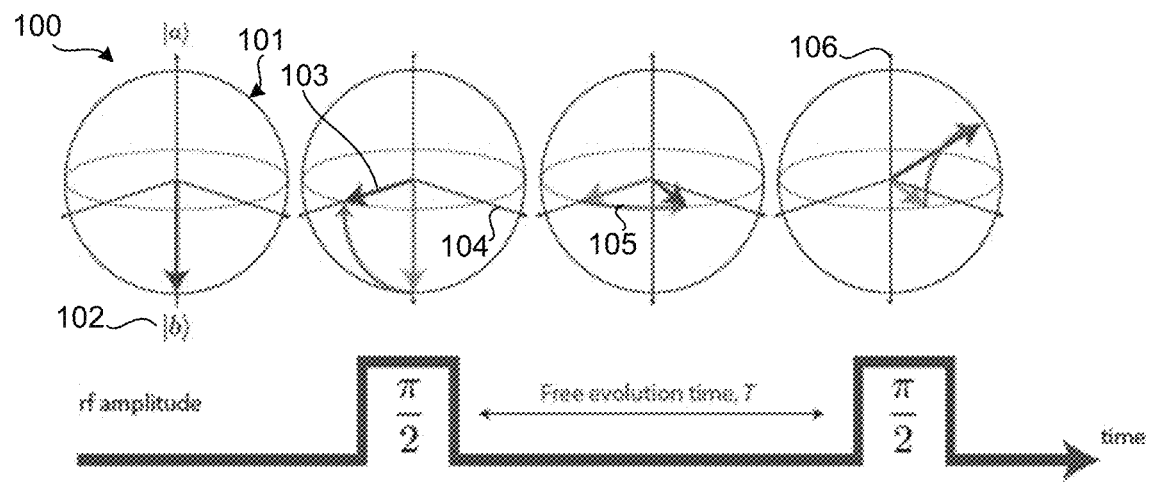
FIG. 1 illustrates a simplified representation of a two-level quantum system in the form of a Bloch sphere according to the prior art.
Figure 2A:
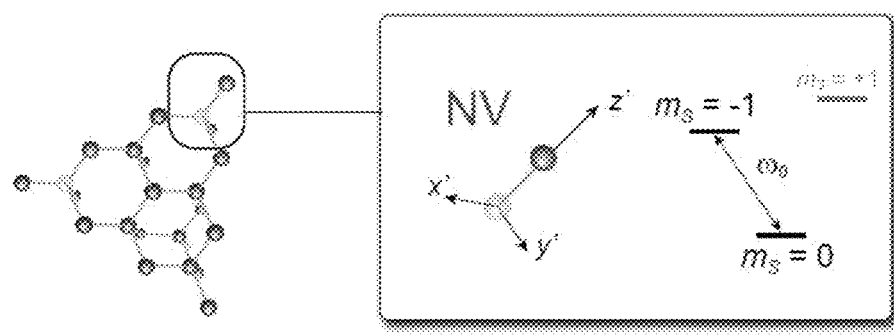

An example will now be described with reference to the following drawings:

FIG. 2a shows an outline of the NV centre in diamond showing coordinate frame and effective two-level system.

Figure 2B:
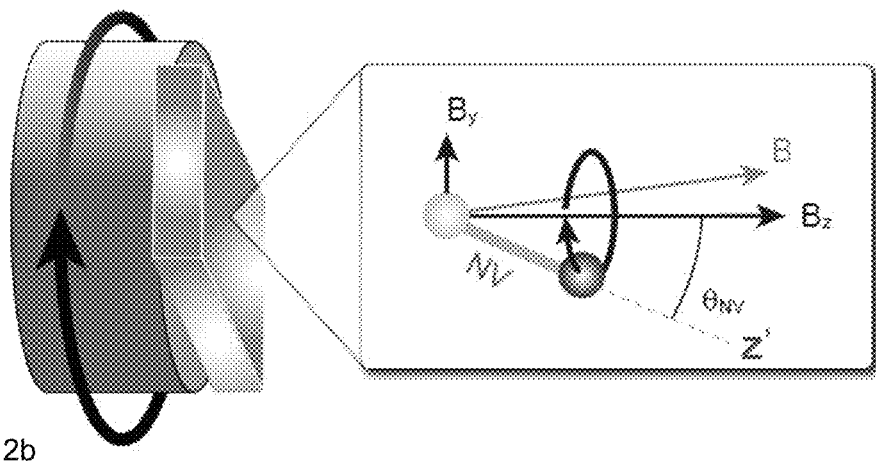

FIG. 2b shows a diamond containing an ensemble of NV centres mounted to a high-speed electric motor that rotates the diamond around an axis z at up to 200,000 rpm (3.33 kHz). One of the four NV orientation classes (z') makes an angle of $\theta_{NV} \approx 4°$ to the rotation axis. A 5.7 mT magnetic bias field is aligned parallel to z. When a transverse magnetic field $B_y$ is applied, the Zeeman shift of the NV becomes time dependent since $\Delta(t) \propto B(t) \cdot \hat{z}'$ in the NV frame. The time-dependent magnetic field can then be measured with a spin-echo pulse sequence performed in the physically rotating frame, with the relevant sensing timescale now determined by $T_2$ rather than the ensemble dephasing time $T_2^*$.

Figure 2C:
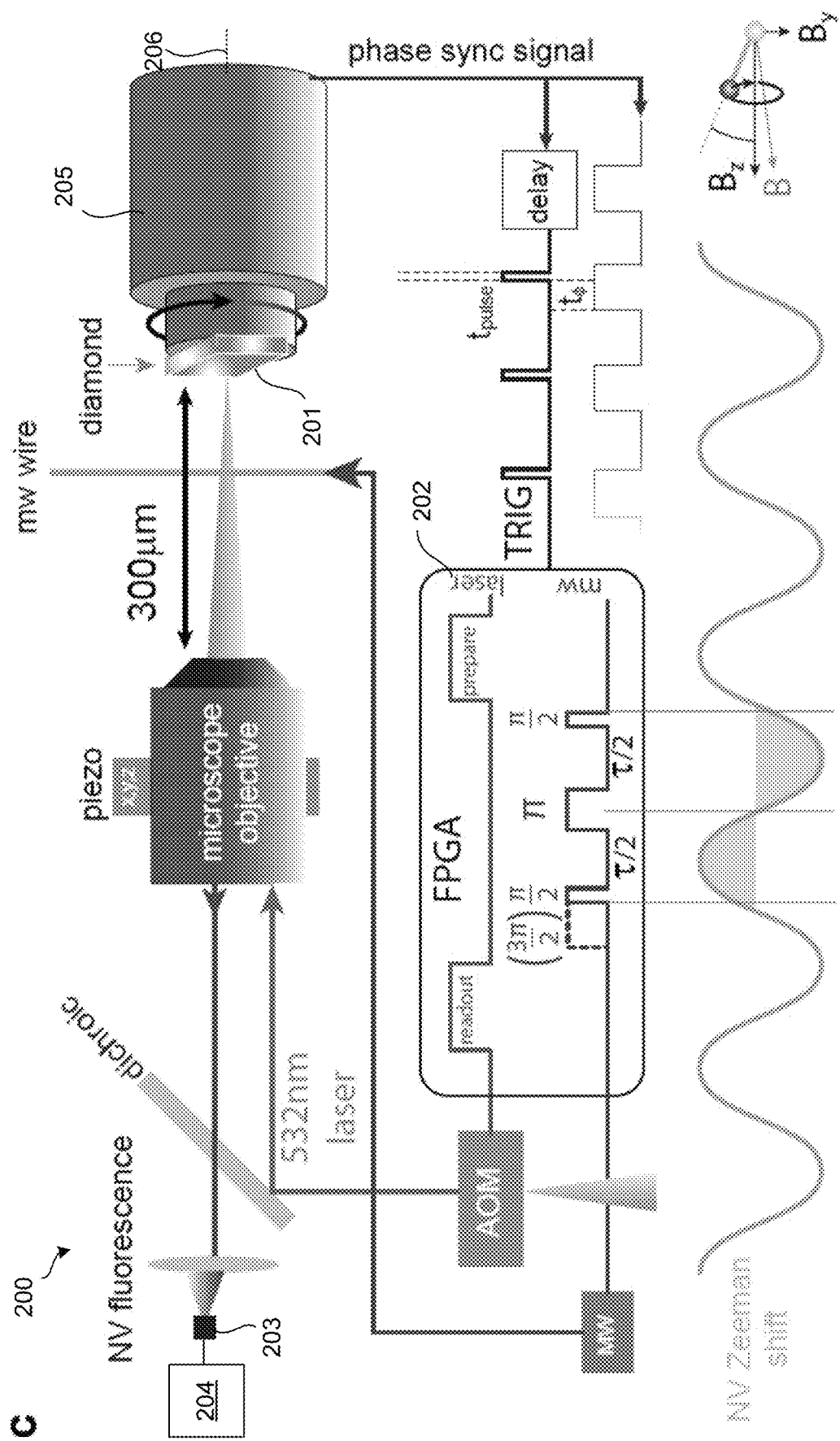

FIG. 2c shows an example setup. The electric motor controller outputs a square pulse synchronous with the motor rotation, which we use to trigger an FPGA pulse generator. The FPGA outputs a spin echo pulse sequence, consisting of laser preparation and readout pulses (separated by one rotation period) and a $\pi/2-\pi-\pi/2(3\pi/2)$ microwave pulse sequence with pulse spacing $\tau/2$. Laser light is focused onto the centre of the diamond rotation with a high-NA objective, which also collects the emitted photoluminesence and directs it onto an avalanche photodiode.

Figures 3A, 3B:
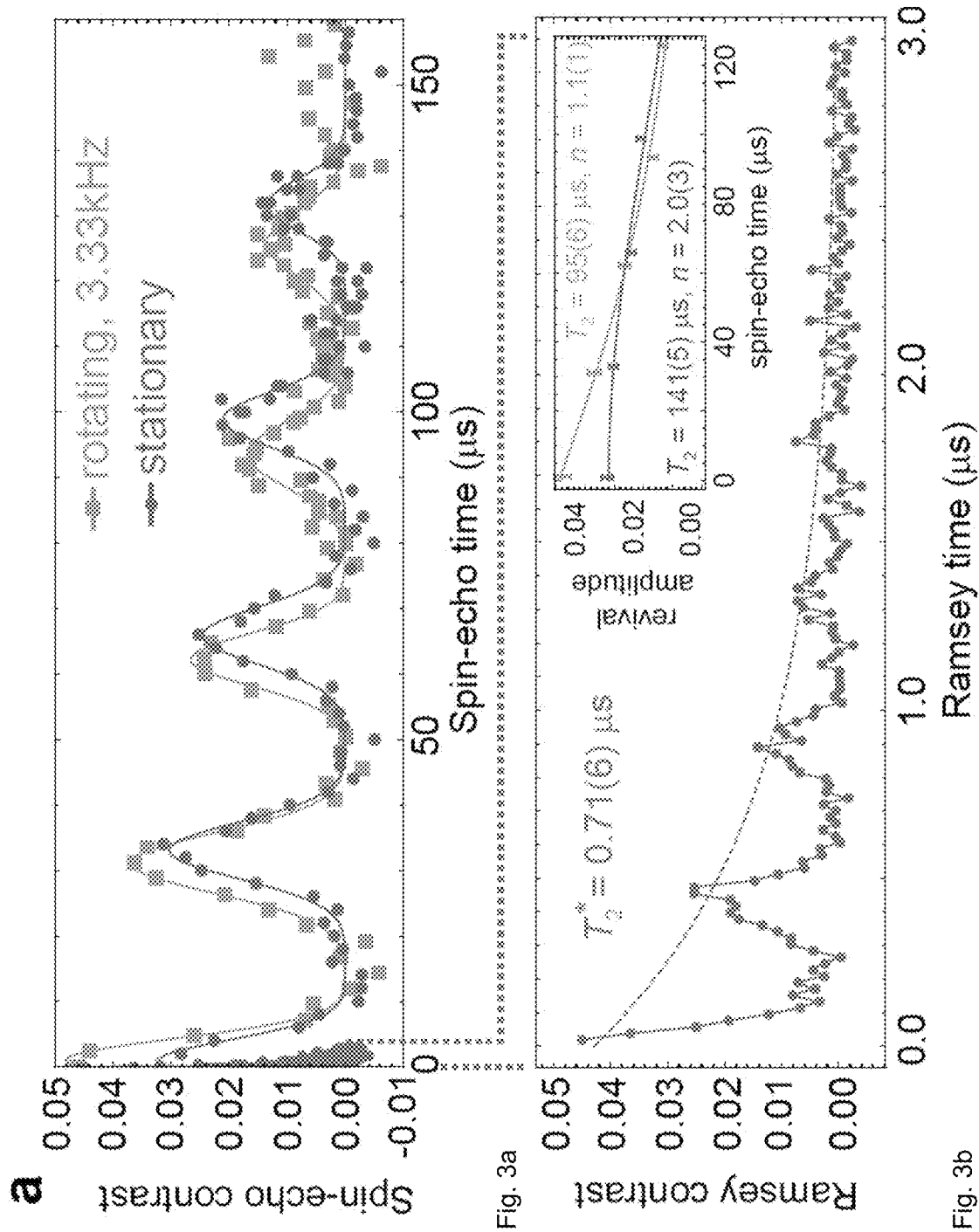

FIG. 3a illustrates the coherence of rotating NV ensemble Stationary NV Ramsey data (circles close to the vertical axis) and NV spin-echo signal at $B_z$=5.7 mT when stationary (circles) and when rotating at 3.33 kHz (squares). A rotationally-induced magnetic pseudo-field adds to $B_z$ for the rotating data, shifting the position of the $^{13}$C revivals.

FIG. 3b illustrates detail of Ramsey contrast showing $T_2^*$ decay envelope due to quasi-static ensemble dephasing. The oscillations present in the Ramsey data are due to the $^{14}$N nuclear hyperfine interaction. Inset: for comparison, the decay envelopes of rotating and stationary spin-echo signal, with effective $T_2$ time and decay exponent allow for >100 times longer interferometric interrogation. Error bars derived from uncertainty in Gaussian fits to spin-echo revivals.

Figure 4A:
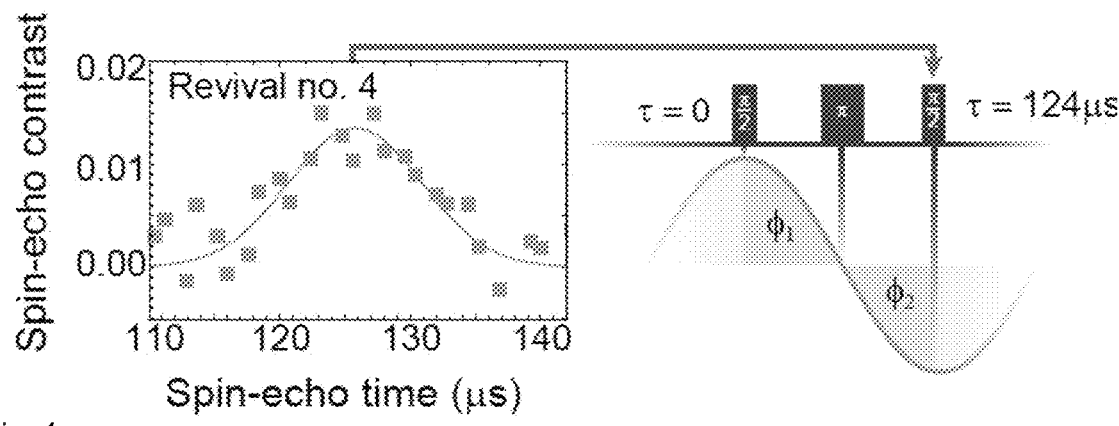

FIG. 4a illustrates rotational up-conversion magnetometry results for an interrogation time of $\tau$=124 μs at a rotation speed of 3.33 kHz, at which the fourth $^{13}$C revival provides the optimum signal to noise for AC magnetometry. The $\pi$-pulse of the echo sequence is concurrent with the zero-crossing of the Zeeman modulation from the up-converted DC field, so that equal and opposite phase shifts ($\phi_1=-\phi_2$) are accumulated on each side of the pulse sequence, yielding the maximum sensitivity for $\tau$ less than one rotation period (300 μs).

Figure 4B:
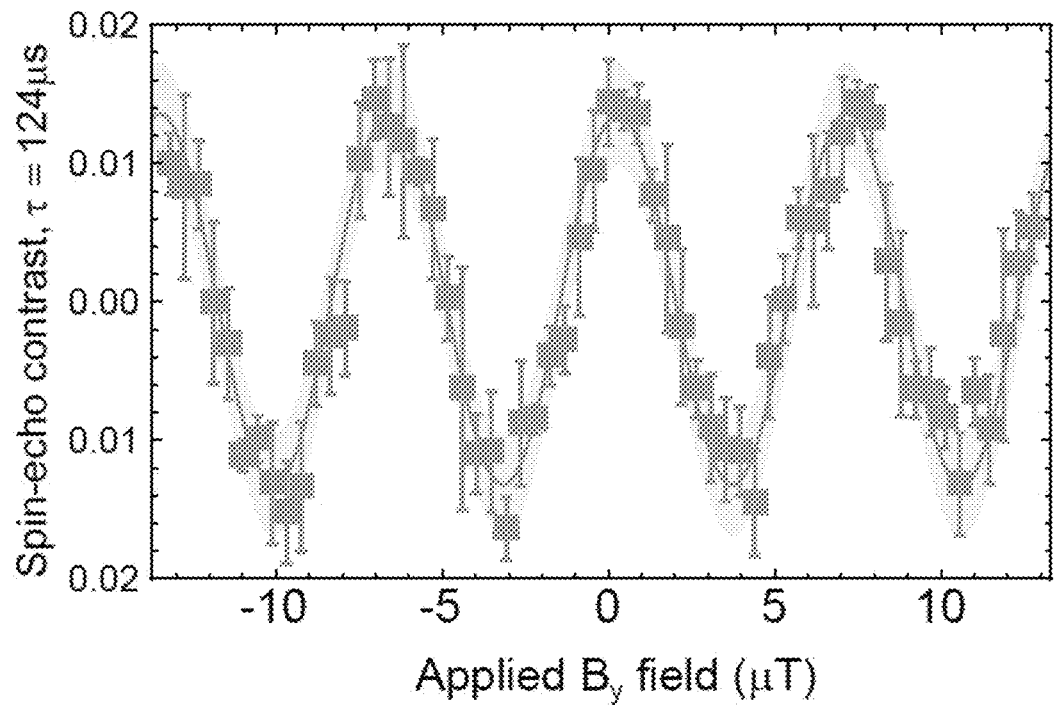

FIG. 4b illustrates a spin-echo signal at $\tau$=124 μs for an additional field applied along the y-axis, orthogonal to z. Error bars are standard deviation of three repeated measurements at each $B_y$, consisting of $2.5 \times 10^5$ repetitions of an echo sequence with $\pi/2$ and $3\pi/2$ readout. Lines are sinusoidal fits and shaded regions denote average error bounds.

Figure 5A:
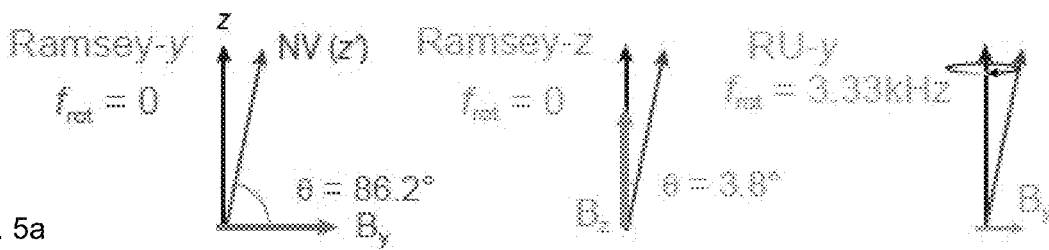

FIG. 5a illustrates a comparison between rotational up-conversion and standard DC Ramsey magnetometry for configurations of NV axis and magnetic field vectors for Ramsey-y, Ramsey-z and RU-y. All experiments were conducted with a $B_0$=5.7 mT magnetic bias field parallel to the rotation axis.

Figure 5B:
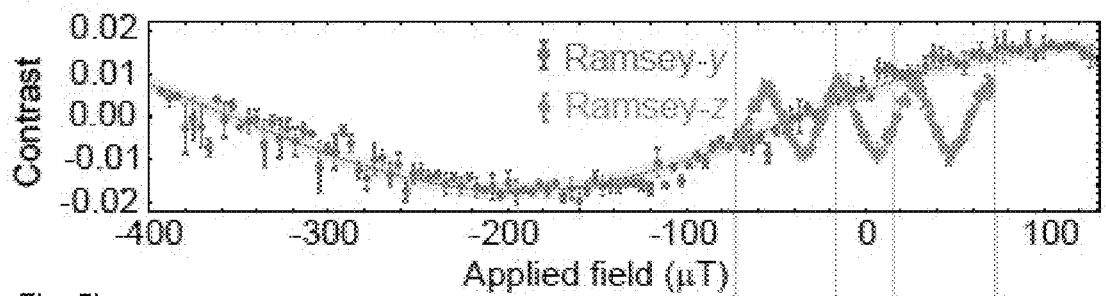

FIG. 5b shows spin-echo magnetometry signals for y-Ramsey (grey circles) and z-Ramsey (green circles) compared to rotational up-conversion (orange squares)

Figure 5C:
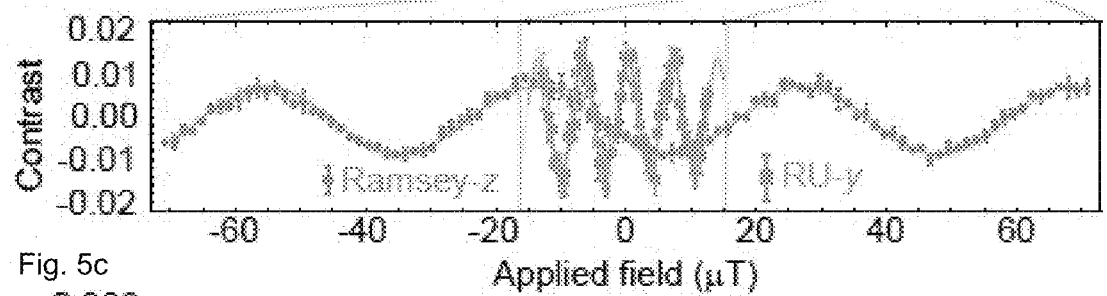

FIG. 5c illustrates measurements consisting of an average signal from three separate acquisitions of $10^6$ experimental repetitions (Ramsey) and $2.5 \times 10^5$ repetitions (RU), error bars denote standard deviation. Lines are sinusoidal fits and shaded regions denote average error bounds.

Figure 5D:
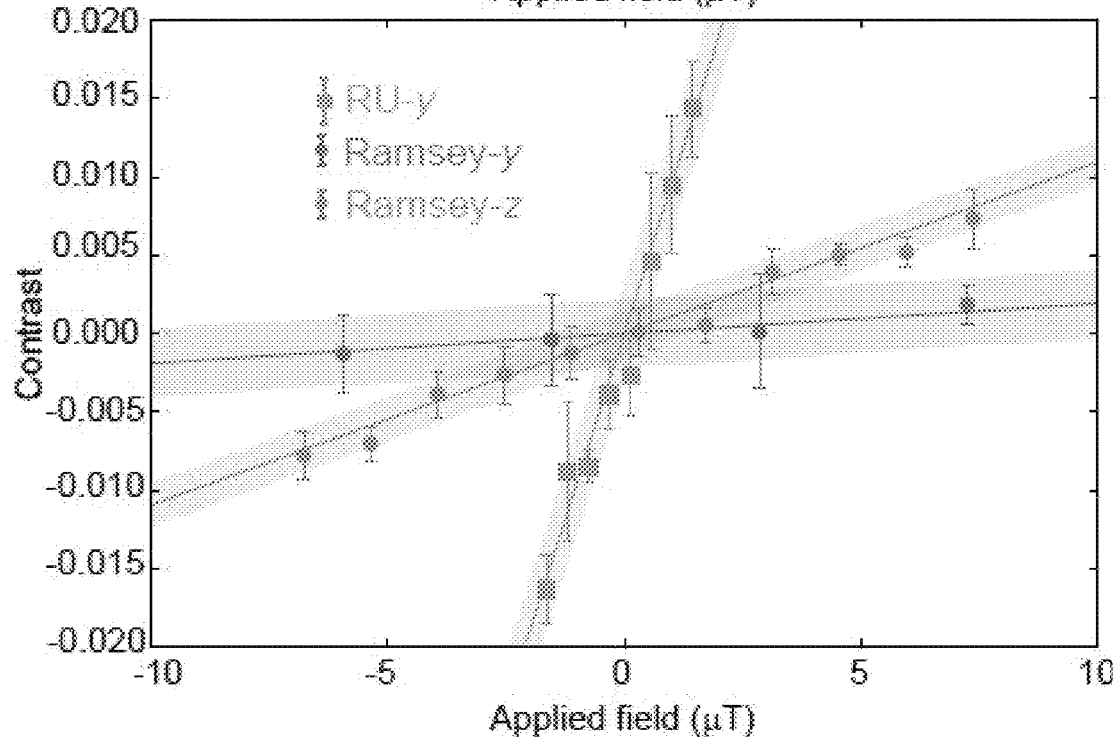

FIG. 5d illustrates a comparison of linear regions of magnetometer signal for all three techniques, with the B-axis scaled so that all traces intercept at B=0.

Figures 6A, 6B:
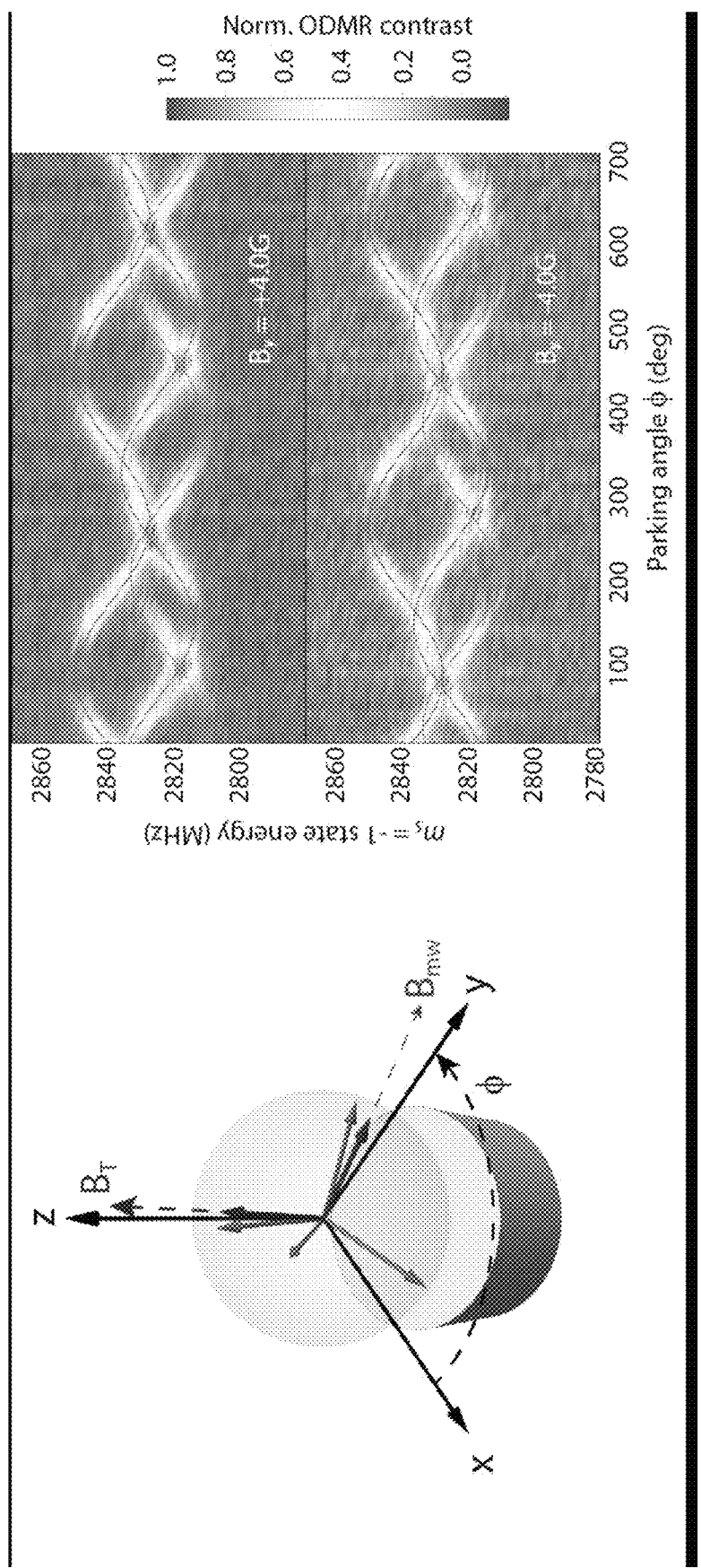

FIG. 6a illustrates a coordinate system showing NV orientation classes (coloured vectors), total magnetic field ($B_T$) and microwave ($B_{mw}$) fields (at $\phi$=130°).

FIG. 6b illustrates an optically detected magnetic resonance (ODMR) contrast as a function of motor park angle $\phi$ for $B_y$=4.0 G (top) and for $B_y$=4.0 G (bottom). The coloured lines denote the Zeeman shifts of the corresponding orientation class depicted in the coordinate system. The alternating fading and recovery of signal contrast is due to the $\phi$-dependent coupling to the microwave field.

Figures 7A, 7B:
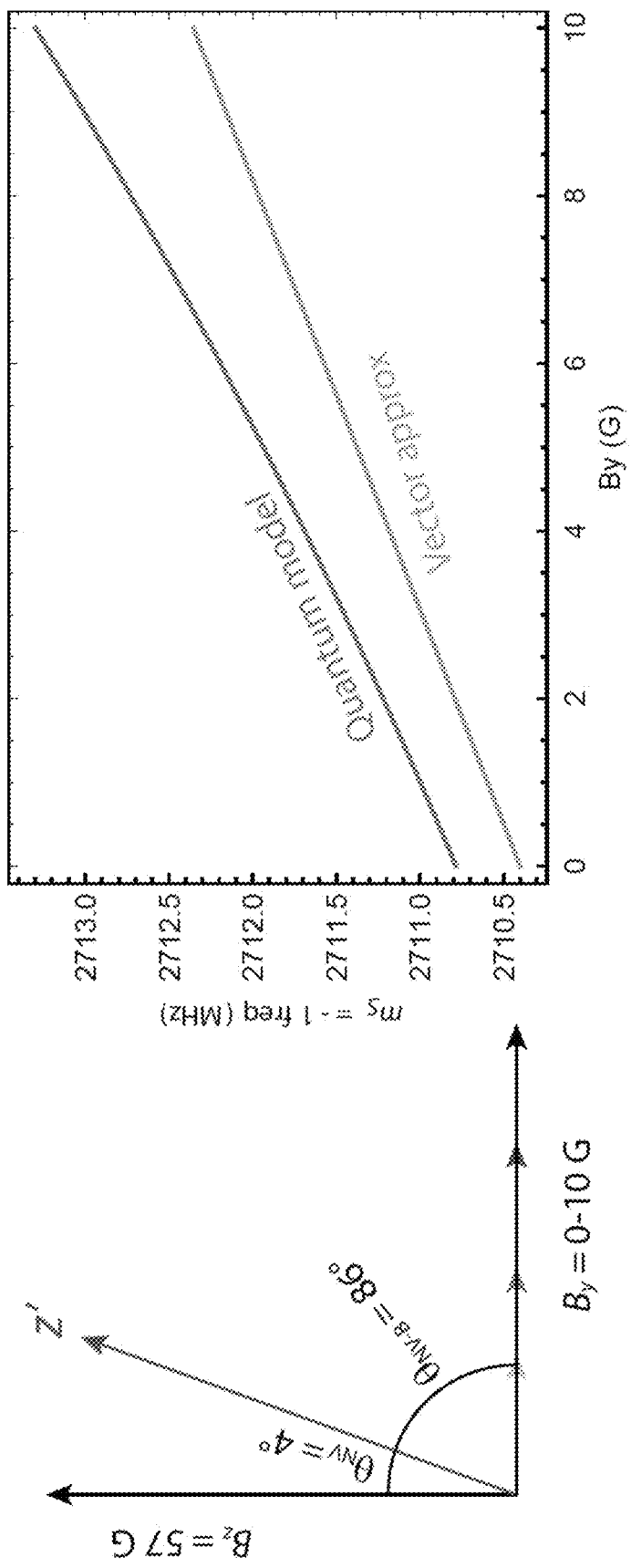

FIG. 7a illustrates a magnetic field configuration that may be used in sensing modalities described below (Ramsey and spin echo, rotating and stationary) with the azimuthal angle of the diamond set so that the z'-axis is tilted towards the y-axis.

FIG. 7b illustrates a response of the z'-oriented NV (which makes an angle of 86° to the y-axis) to an applied y-field. For Ramsey experiments, the maximum y-field used is <1.5 G (and considerably less for spin echo); a linear approximation therefore remains valid.

DESCRIPTION OF EMBODIMENTS

Diamond-based quantum magnetometers are typically more sensitive to oscillating (AC) magnetic fields than static (DC) fields. This impairment is because the ensemble dephasing time $T_2^*$, the relevant sensing time for a DC field, is much shorter than the spin coherence time $T_2$, which determines the sensitivity to AC fields. This disclosure demonstrates measurement of DC magnetic fields using a physically rotating ensemble of nitrogen-vacancy centres at a precision ultimately limited by $T_2$, rather than $T_2^*$. A rotator rotates the host diamond with a period comparable to $T_2$, such that the angle between the NV axis and the magnetic field to be detected changes as a function of time, upconverting the static magnetic field to an oscillating field in the physically rotating frame. Using spin-echo interferometry, there may be more than a hundredfold increase in sensing time compared to a conventional Ramsey experiment. With modifications, this scheme could realise DC sensitivities equivalent to demonstrated AC magnetic field sensitivities of order 0.1 nT $Hz^{-1/2}$ with NV centers.

$T_2$ is typically several orders of magnitude larger than $T_2^*$, resulting in sensitivity improving by $\sqrt{T_2^*/T_2}$, but at the expense of insensitivity to DC magnetic fields. This disclosure demonstrates a quantum magnetometry method based on an ensemble of rotating spin qubits which can detect DC magnetic fields with a sensitivity ultimately limited by $T_2$, rather than $T_2^*$.

The disclosed technique upconverts the DC magnetic field to AC by rotating the host diamond crystal with a period comparable to $T_2$ with the NV crystal axis at an angle $\theta_{NV}$ to the rotation axis. In the presence of a small DC magnetic field transverse to the rotation axis, the Zeeman shift of the NV is modulated at the rotation frequency in proportion to the DC field magnitude. It is therefore possible to employ spin-echo magnetometry to detect the modulated Zeeman shift in the physically rotating frame, which refocuses in-crystal noise and extends the maximum sensing time to $T_2$.

Coherent quantum sensing with solid-state spin systems proceeds amongst interactions between the central sensor spin and a surrounding bath of other spins. In bulk diamond, for example, these bath spins may be either substitutional nitrogen (P1) electron spins or $^{13}C$ nuclear spins. Due to the projective nature of quantum measurement and very low photon collection efficiencies, it is necessary to average measurements over integration times far exceeding typical bath correlation timescales. As a result, the perturbations from bath spins are incoherently averaged, leading to dephasing on a timescale of $T_2^*$. Here, $T_2^*$ refers to dephasing over an ensemble of measurements, rather than the conventional NMR definition, which typically pertains to inhomogeneous precession in an ensemble of spins.

Up-conversion using rotation is a solution that brings the benefits of AC measurement to DC sensing, with the particularly attractive feature that the only required modification is sensor rotation. Up-conversion with sensor rotation as disclosed herein relies on the vector properties of the magnetic field, rather than modulating the source of the magnetic field to be measured, and is therefore equally applicable to microscale sensing with rotating single qubits and macroscopic sensing with large ensembles of NV sensors.

EXAMPLE

FIG. 2c illustrates an example magnetometer 200 for measuring a magnetic field comprising a solid state quantum system 201, such as a diamond with a nitrogen vacancy centre (shown in FIG. 2a) and a control signal generator 202 to set the quantum system into a quantum state that accumulates a phase over time depending on the magnetic field. Generator 202 may be implemented as an FPGA, desktop computer or other computing system. There is also a detector 203 to measure a signal from the quantum system 201 indicative of the accumulated phase at a measurement time after the setting of the quantum state. A processor 204 is connected to detector 203 and determines a magnetic field measurement based on the signal measured by the detector 203. The quantum system 201 is mounted on a rotator 205 (also shown in FIG. 2b) that is configured to rotate the quantum system 201 about a rotation axis 206 at a rotation rate that modulates the magnetic field over the measurement time.

Diamond 201 contains an ensemble of NV centres is mounted to the spindle of an electric motor that rotates at 200,000 rpm (3.33 kHz). In the stationary coordinate system with z' the NV axis, the Hamiltonian is time-independent and given by $$H = D_{zfs} S_z^2 + \gamma S \cdot B, \quad (1)$$

with the electron gyromagnetic ratio $\gamma = 28$ $GHzT^{-1}$, $S = (S_x, S_y, S_z)$ the spin vector, $D_{zfs} = 2.87$ GHz the zero field splitting and B the magnetic field. When $\gamma|B| = D_{zfs}$, the Zeeman shift term depends only on the strength and orientation of the magnetic field as shown in FIG. 6b. If the NV axis is then rotated around z at an angular frequency $\Omega$ in the presence of a magnetic field with, for example, a transverse y-component $B = (0, B_y, B_z)$, the Zeeman shift becomes time-dependent, and the $m_S = 0 \to m_S = 1$ transition frequency is given by $$\omega(t) = D_{zfs} - \gamma[B_z \cos(\theta_{NV}) - B_y \sin(\theta_{NV}) \cos(\Omega t - \phi_0)] \equiv \omega_0 + \gamma B_{UC}(t), \quad (2)$$

with $\theta_{NV}$ the angle between the NV axis and rotation axis, $\phi_0$ some arbitrary initial phase, $\omega_0 = D_{zfs} - B_z \cos(\theta_{NV})$ and $B_{UC}(t) = B_y \sin(\theta_{NV}) \cos(\Omega t - \phi_0)$ the up-converted DC $B_y$ field, oscillating at the rotation frequency. Rotation of the NV axis modulates the Zeeman shift at the rotation rate, and the projection of the DC field parallel to the NV axis $B_y \sin(\theta_{NV})$ yields sensitivity to the transverse field component $B_y$ in the NV frame.

In one example, the diamond sample is a (111)-cut electronic grade sample grown using chemical vapour deposition, containing natural (1.1%) abundance $^{13}C$ and an NV concentration of $10^{15}$ $cm^{-3}$. Of the four orientation classes present in the diamond, one makes an angle of 3.8° to the rotation axis while the other three make angles of approximately 106°, 112° and 111°. While the sensitivity to a magnetic field transverse to the rotation axis is $\propto \sin \theta_{NV}$, one orientation class with $\theta_{NV} = 3.8°$ can be used. Although three orientation classes make large obtuse angles ($\sin \theta \approx 0.93$) to the rotation axis (and therefore an increased sensitivity), the use of an addressable two-level system for quantum measurement would be facilitated by a static bias field to break the degeneracy of the $m_S = \pm 1$ states of the NV ground state. In the presence of this bias field, which is parallel to the rotation axis (to prevent distortions), these three orientation classes are essentially degenerate, and measurement of a particular class using state-dependent photoluminesence may be difficult. Therefore, in one example, the NV orientation class is chosen to be almost parallel to the rotation axis, since this greatly simplifies the measurement protocol. In other examples, diamonds containing preferentially oriented NVs or crystals polished to an appropriate angle can be used as detailed below.

In the presence of a 5.7 mT magnetic bias field parallel to the rotation axis, the two-level splitting of the $m_S = 0$ and $m_S = 1$ Zeeman states (also "quantum spin states" herein) is 2.711 GHz and microwave pulses (from a control signal generator) resonant with this transition control the populations and coherences for quantum sensing. A microscope objective mounted on a scanning piezoelectric stage focuses 532 nm light to a 600 nm spot and directs red fluorescence emitted by the NV centers onto an avalanche photodiode, in a confocal microscope configuration. A 20 μm diameter copper wire located 100 μm above the diamond surface is used to apply microwave fields. Magnetic fields are applied using a single multi-turn coil coaxial with the motor spindle, behind the diamond. Coil pairs along the x and y axes are used to create the test fields for rotational up-conversion. A 1.0 mm thick mu-metal shield on the front face of the motor screens the diamond from magnetic fields originating from the pole pieces of the motor.

Optical preparation, readout and microwave state manipulation sequences are synchronized to the rotation of the diamond using a pulse generator triggered by the electric motor phase synchronization signal. The trigger ensures phase synchronicity with the up-converted field, and can be delayed in order to synchronize the interferometric sequence to any particular phase. The focus of the preparation and readout laser beam is positioned as close as possible to the rotation centre of the diamond to reduce the effects of NV motion during quantum state preparation and readout. A 3 μs laser pulse is applied to prepare the NV ensemble into the $m_S=0$ state, followed by a $\pi/2-\pi-\pi/2$ spin-echo microwave pulse sequence with interpulse spacing $\tau/2$. The fluorescence contrast from $10^5$ or more repetitions of the experiment with a final $\pi/2$ projection pulse is compared to a sequence with the final $\pi/2$ pulse replaced with a $3\pi/2$ pulse in order to compute a normalised spin echo signal S.

Coherence of Rotating Qubits

It is useful to examine deleterious effects of physical rotation or up-converted noise by comparing the stationary and rotating spin-echo signals. For diamonds containing <1 ppm N and natural abundance $^{13}$C, the dephasing time is at most: 3 μs due to phase-incoherent sampling of the nuclear magnetic dipole fields felt by the NV during a Ramsey measurement. Weaker dipolar-mediated $^{13}$C spin flip-flops limit the maximum spin-echo coherence time $T_2$ to a few hundred microseconds. The spin-echo signal is modulated by the $^{13}$C interaction, with measurement contrast limited to revivals spaced at multiples of twice the nuclear spin Larmor precession period.

FIGS. 3a and 3b show the stationary Ramsey and spin-echo signals compared to the spin-echo signal with the diamond rotating at 3.33 kHz, at a common bias magnetic field strength of $B_z=5.7$ mT. The Ramsey signal decays rapidly, with a characteristic time of $T_2^*=0.71(6)$ μs. The spin-echo signals exhibit the characteristic $^{13}$C modulation with an overall decoherence envelope $\exp(-(\tau/T_2)^n)$ due to nuclear spin bath dynamics. The decoherence time $T_2$ and decay exponent n change depending on the strength of the magnetic field.

A clear difference between the stationary and rotating spin-echo signals is a shift in the revival times, due to rotation of the diamond. In this example, rotation opposes the precession direction of the $^{13}$C nuclear spins. This results in a 0.31 mT magnetic pseudo-field adding to the bias magnetic field for the nuclear spins. Rotating-NV sensor spin-echo coherence exists well beyond the $T_2^*$ limit with no other substantial difference between rotating and stationary NV spin-echo signals. This demonstrates that no significant noise sources are introduced to the spin-echo measurement due to the physical rotation of the diamond. For the data shown in FIG. 3a and 3b the spin-echo pulse sequence was not synchronized to the rotation of the diamond and we used a measurement scheme described previously in A. A. Wood, E. Lilette, Y. Y. Fein, V. S. Perunicic, L. C. L. Hollenberg, R. E. Scholten, and A. M. Martin, Nature Physics 13, nphys4221 (2017). Any misalignment of the bias magnetic field from the rotation axis then manifests as an up-converted field with random phase, which reduces the measured $T_2$. Despite this, the interferometric contrast is of a comparable magnitude to the stationary spin-echo signal in the vicinity of the fourth $^{13}$C revival, near $\tau=124$ μs, and can be used as the sensing time to demonstrate rotational up-conversion.

DC Magnetometry with Rotational Up-Conversion

For maximum phase accumulation and hence best sensitivity, the spin-echo measurement time may be equal to the period of the up-converted field, i.e the rotation period. In some cases, however, the required rotation speeds ($T_2^{-1}=7$ kHz) may not be sustained by a chosen motor for the extended durations chosen to achieve adequate photon counting statistics. It is therefore possible to use $f_{rot}=3.33$ kHz, and adjust the sequence timing (which is phase synchronous with the up-converted DC field) so that each half of the spin-echo sequence measures an equal and opposite phase either side of the up-converted field zero crossing (FIG. 4a). The maximum phase accumulation possible in this configuration is thus 2.7 times less than if the whole period were measured. We then varied the applied $B_y$ field by changing the current in the y-oriented coil pair. FIG. 4b shows the spin echo signal for a measurement time of $\tau=124$ μs as a function of the applied $B_y$ field, confirming DC fields can be detected using rotational up-conversion. In $T_{int}=300$ s of measurement time, we perform $2.5 \times 10^5$ repetitions of both $\pi/2$ and $3\pi/2$ readouts. The minimum detectable field is given by $$\delta B_{min} = \sigma (dS/dB)^{-1}, \quad (3)$$

with σ the standard deviation of the spin-echo signal S taken from three repeated measurements. For this data we find $\delta B_{min}=0.33(2)$ μT, with a corresponding sensitivity per unit bandwidth of $\eta=B_{min}\sqrt{T_{int}}=5.8(4)$ μTHz$^{-1/2}$ at DC.

Comparison with Ramsey DC Magnetometry

The operating sensitivity, which derives from the minimum detectable field (Eq. 3), depends on many factors specific to individual experiments, such as collection efficiency, state manipulation fidelity and the magnitude of noise in the environment where the sensor is evaluated. The focus of this work is the response of the NV interferometric signal to an applied magnetic field, as the process of up-conversion demonstrated here primarily increases the magnetometer response dS/dB. For this reason, we compare the response of our rotational up-conversion magnetometry to conventional, stationary Ramsey interferometry in the same experimental environment (FIG. 5a).

To compare up-conversion magnetometry to Ramsey, the diamond is first held static and oriented so that the NV axis is tilted toward the y-axis, ensuring maximum possible sensitivity along this axis. In this configuration (denoted Ramsey-y), the NV axis makes an angle of $\theta_y=86.2°$ to the y-field, and the Zeeman shift of the $m_S=-1$ transition is still linearly approximated by $\omega_0+B_y \cos(\theta_y)$ for $B_y<0.5$ mT (FIG. 6a,b). While Ramsey-y serves as a like-for-like comparison between upconverted and stationary measurement of a transverse field, it is not representative of the optimum DC magnetometry in our setup, which would align the test field along the NV axis. We therefore also compared the Ramsey response to a z-oriented field (Ramsey-z), which makes a much smaller angle of 3.8° to the NV axis. Due to the smaller angle to the NV axis, the magnetometer is 15 times more sensitive to a change in the z-field compared to a change in the y-field of equal magnitude, and is essentially the best DC magnetometry possible with our experiment, $\gamma_e B_z \cos 4° \approx \gamma_e B_z$. FIGS. 5b, 5c shows the interferometry signals from rotational up-conversion sensing of a y-field (RU-y) and stationary Ramsey-y and Ramsey-z interferometry with $\tau=0.86$ µs. We e use $\tau=0.86$ µs rather than $\tau=T_2^*$ due to the hyperfine modulation of the Ramsey contrast, evident in FIGS. 3a, 3b.

The central result is shown in FIG. 5d, where we compare the slope of the spin-echo signal for all three techniques, and the consequent sensitivity parameters are summarised in Table 1. We show rotational up-conversion offers a substantial increase in the magnetometer response dS/dB: 50 times larger than Ramsey-y and 9 times larger than Ramsey-z. This confirms the basic premise of our technique: a longer measurement time, and thus increased slope, is possible only because of elimination of the nuclear spin bath dephasing. However, the signal noise in rotational up-conversion measurements is almost twice that of Ramsey-y, which is in turn almost 1.6 times greater than Ramsey-z. The additional noise in the Ramsey-$y$ data is attributed to lower stability of the coil current power supply at higher currents Combined with the longer integration time of the up-conversion measurements compared to the Ramsey measurements, this leads to a comparable sensitivity per-unit-bandwidth for up-conversion and Ramsey-z in the current setup with low $\theta_{NV}$.

Some increased noise of the up-converted DC signal is expected, because roughly four times fewer photons are collected in the 300 s integration time used for rotational upconversion here compared to the shorter Ramsey experiments, which run more repetitions in the 10 s integration time. We observe that the Ramsey measurements exhibit photon collection statistics only 0.6 dB above the shot noise limit, while with rotational up-conversion we measure photons at 3.6 dB above photon shot noise, which we attribute to drifting laser power over the longer integration times of RU-y. The increased dead-time of the rotational up-conversion measurement also plays a significant role. In our experiments, the spin-echo measurement time $\tau$ is dictated by the coherence time of the diamond (and $^{13}$C revival time), but the duty cycle is determined by the rotation speed of the motor. The finite pumping time of the laser readout pulse impinges into the next period of the rotation, making back-to-back π/2 and 3π/2 readouts on alternate periods of the motor difficult with our current experimental hardware. This effectively limits the duty cycle to one measurement every two periods and thus a dead time of order 500 µs. This effect alone results in comparable sensitivities for static and rotating measurements.

Noise Sources in Up-Conversion Magnetometry

It is interesting to examine this result in more detail, since it suggests that either the up-conversion method is imperfect, or that a significant amount of noise is being up-converted. Several technical issues contribute to the increased noise for the up-converted signal that are absent in the Ramsey measurements. For example, the stationary Ramsey measurements can be run with π/2 and 3π/2 readouts performed back to back for a total intervening time of about 4 µs, offering resilience to common-mode drifts of microwave power, temperature and ambient magnetic noise between π/2 and 3π/2 readouts. It is worth noting that aside from collection efficiency, the Ramsey-z measurement cannot be significantly improved further.

In general, we can subdivide the noise sources into in-diamond instrinsic sensor noise sources that co-rotate with the NV sensor, such as the surrounding $^{13}$C nuclear spins, and extrinsic environmental noise in the stationary lab frame, such as drifting magnetic bias fields or temperature variations. Since the diamond rotates around a particular axis in space, the up-conversion or suppression of magnetic field noise is vectorial in nature. In contrast, temperature shifts are rotationally invariant and not modulated by sensor rotation, and are therefore eliminated by the spin-echo sequence. Environmental magnetic field drifts are either upconverted to the rotation frequency if transverse to the rotation axis, or eliminated by the spin-echo sequence if parallel to it. The latter effect is an added benefit to using a z-oriented magnetic bias field: drifts in the amplitude of a the bias field parallel to the rotation axis will not be upconverted to AC frequencies, since such drifts appear as static level shifts in a spin-echo sequence. Noise or drifts in DC field components transverse to the rotation axis will be upconverted to AC frequencies.

A spin-echo sequence applied to a stationary NV refocuses the coherent in-diamond bath noise as well as all quasi-static DC field perturbations. In the rotating up-conversion sequence, the same components of bath noise are refocused, but only one vector component (parallel to z, the rotation axis) of the extrinsic magnetic noise is suppressed. An associated benefit is that intrinsic bath noise, which is typically the dominant contributor to the ensemble dephasing time $T_2^*$, can then be separated from noise, or signal, in the sensing environment. On the other hand, up-converted noise may result in a reduced signal-to-noise ratio of the DC field of interest. The process of up-conversion, in our case linked to the performance of the electric motor, may also introduce noise. For example, wobbling of the motor spindle or a jittering rotation period will introduce noise into the upconverted signal. We have recently used identical apparatus to rotate diamonds containing single NV centres that could still be reliably imaged near the diffraction limit and controlled at up to $f_{rot}=5.2$ kHz, suggesting the mechanical rotation is of high enough quality to be ruled out as a significant contribution to noise in the up-converted signal.

Other experiments we performed (data not shown) detected evidence of drifts and current ripple in the bias coils used to create magnetic fields, which would have a proportionately more severe effect on rotational up-conversion: fast current noise originating from power supply switching (up to: 100 kHz) will be detectable in a spin-echo measurement, rotating or stationary, but not Ramsey with $\tau<1$ µs. Further work, especially testing in a significantly cleaner magnetic environment, is needed to conclusively identify the role of noise sources in rotational up-conversion when compared to the Ramsey measurement in this work.

Operating Sensitivity

The shot-noise limited sensitivity for rotational up-conversion magnetometry as described herein is given by $$\eta \approx \frac{\pi}{\gamma 2 C \sin\theta_{NV}} \frac{\sqrt{\tau+t_D}}{\tau} \quad (4)$$

with C≈0.02 our typical collection efficiency and the dead time $t_D$ includes the time required to prepare and readout the NV spin. Table 1 summarises the operational and projected shot-noise limited sensitivity for each technique compared in this work with our current experimental parameters and limitations. We note that the duty cycle limitations in our current realisation (detailed in the previous Section) result in a comparable shot-noise limited sensitivity for Ramsey and up-conversion magnetometry, a factor of 2 below what we observed. With these limitations in mind, we can also calculate the potential of rotational up-conversion with our demonstrated rotation speeds and collection efficiencies but using a diamond sample with two simple alterations: a larger angle $\theta_{NV}$=54.7°, which is obtained by using a diamond with a (100)-cut face and a slightly longer $T_2$ time so that we may measure for a full period of the up-converted DC field, τ=300 μs. These improvements highlight the potential of rotational up-conversion, yielding a 32 times improvement over the proof-of-principle results demonstrated in this work. Additional improvements to DC field sensitivity are detailed below.

TABLE 1

DC sensitivity comparisons for the three experimentally demonstrated techniques and rotational up-conversion with two simple alterations: measuring for the whole period of the up-converted field (τ = 300 μs) and using a (100) -cut diamond with $\theta_{NV}$ = 54.7°. The parameters are response dS/dB, operating sensitivity per unit bandwidth $\eta_{Opr}$, shot-noise limited sensitivity with operating duty cycle $\eta_{SN}$.

| | dS/dB | $\eta_{Opr}$ | $\eta_{SN}$ |
|---|---|---|---|
| units | $10^{-3}\,\mu T^{-1}$ | $\mu THz^{-1/2}$ | $\mu THz^{-1/2}$ |
| Ramsey- y | 0.02(1) | 35(9) | 25 |
| Ramsey- z | 1.1(1) | 4.0(2) | 1.8 |
| RU- y | 9.5(6) | 5.8(4) | 2.3 |
| RU- y (best) | 308 | — | 0.08 |

Discussion

This disclosure provides a method for magnetic sensing with NV spin sensors. Rotational up-conversion magnetometry as disclosed herein exhibits the increased sensing time and concomitant improved response to DC fields compared to conventional Ramsey sensing, and in a like-for-like comparison (RU-y and Ramsey-y) exhibits a substantially improved sensitivity per unit bandwidth. The improvement to transverse field sensing demonstrated herein is indicative of the benefits to DC sensing. The duty cycle can be made near unity for coherence times equal to or exceeding the rotation period of the diamond, and the need to operate on every second rotation period can be circumvented with a retriggerable pulse generator.

Diamonds with a higher NV density may be used, though a tradeoff exists between the density of the NV ensemble and the resulting coherence time: high density, nitrogen-rich samples increase the number of participating NV sensors, and thus photon collection up to a point beyond which $T_2$ is reduced due to interactions with paramagnetic nitrogen centres. For rotational upconversion it is preferable that $1/f_{max}\hat{}T_2$. For this reason, we consider ensemble densities where NV-P1 interactions are negligible ($n_{NV}\hat{}10^{15}$ cm$^{-3}$) and coherence times are on the order of rotational periods achievable with our current motor. Ensembles with natural abundance $^{13}$C may have coherence times of $T_2 \approx 600$ μs, and isotopically-pure $^{12}$C diamonds hosting single NV centres may have coherence times of greater than 2 ms, still substantially higher than the corresponding $T_2^*$ dephasing times of: 100 μs. Such long coherence times offer the prospect of measuring multiple rotations even with slower motors. For a diamond with $T_2$=2 ms and the maximum rotation speed of the motor (8.3 kHz), almost 17 complete rotations could be observed, and multiple-pulse sequences such as XY-N or CPMG could be employed, resulting in a significant improvement in sensitivity (see below).

The angle $\theta_{NV}$ between the NV axis and the rotation axis can also be increased, a (100)-cut diamond yields $\theta_{NV}$=54.7°. While this example used a (111)-cut diamond with small $\theta_{NV}$ to easily allow a single orientation class to be isolated and addressed, this issue can be resolved by using diamonds containing NVs with a high degree of preferential orientation (>90%). Diamonds containing all four orientation classes may also be laser-cut and polished to a preferred angle, allowing for four independently addressable NV orientation classes, which would enable vector sensitivity in the rotational plane. Using preferentially-oriented samples would increase the contrast of the spin-echo signal, since less non-participating NV centres would be present. A diamond with an ensemble density of NV centres preferentially aligned along one axis with the same photon count rate as the diamond used in this disclosure (3×10$^6$ s$^{-1}$) would yield an order of magnitude improvement in state readout efficiency, C≈0.1. Using an n=17 π-pulse sequence at a rotation speed of 8.3 kHz, C=0.1, $\theta_{NV}$=54.7° and $T_2$=2 ms yields a DC shot-noise limited sensitivity of 0.3 nT Hz$^{-1/2}$. This projected sensitivity relates to the same experimental configuration described in this disclosure with a different diamond sample.

More substantial improvements to photon collection efficiency by using a larger optical addressing region may allow DC field sensing into the picotesla range, allowing realistic diamond-based quantum sensors to access improved sensitivity to static magnetic fields, and with the immunity to drifts in the ambient temperature provided by spin-echo interferometry. Ultimately, up-conversion offers the prospect of a maximum $\sqrt{T_2^*/T_2}$ improvement in sensitivity. Our demonstration here focuses on magnetic fields, but equivalent improvements to static electric field sensing may be possible, where the direction of the electric field (and strain field) determines the level splitting. Another interesting extension concerns geometric phase accumulated by the NV as its axis is rotated. Although negligible in many examples, in the proposed improvements where the NV axis makes a significant angle to the rotation axis geometric phase accumulation may be substantial, up to 2.7 rad for a complete rotation with $\theta_{NV}$=54.7°. We note however that the geometric phase is a level shift that can be cancelled in a spin-echo sequence. Alternatively, measurement of geometric phase can serve as a gyroscope, an independent diagnostic of the stability of rotation as a means of DC field upconversion.

Quantum Model

For same examples, accurate knowledge of the NV tilt angle $\theta_{NV}$ and magnetic field geometry is desirable in order to calibrate the response of the magnetometer to known magnetic fields. We therefore compared the magnetic field response to a calculation of the NV eigenvalues from the coupling Hamiltonian, $$H = D_{zfs}S_z^2 + \gamma S \cdot B, \quad (5)$$

with $\gamma/2\pi$=28 GHzT$^{-1}$, S=($S_x,S_y,S_z$) the NV spin vector and $D_{zfs}/2\pi$=2.87 GHz the zero field splitting. We compute the components of an arbitrary magnetic field B in the {x', y', z'} basis for each NV orientation class and numerically diagonalise Eq. 5. In doing so, we also consider the temperature-shifted zero-field splitting, $D_{zfs,T}$=2869.71 MHz, and independently measure the magnetic field strength using the measured period of $^{13}$C spin-echo revivals. In addition to the 57 G z-bias, we applied a 4 G field with the y-coils and collected ODMR spectra from the three other orientation classes (which are at a significant angle to the z-field) as the diamond, while stationary, was stepped through one full rotation. FIG. 6a shows the data and a fit based on the numerical diagonalisation of Eq. 5.

The data is well fit by the model based on Eq. 5. A simple vector model, for instance $\omega_{Zeeman} \propto (x',y',z')$. B may not fit the data for our experimental parameters, due to the large z-field mixing eigenstates of the three NV orientation classes that make an angle of: 70° to z. From the model, we can determine that $\theta_{NV}=3.67°$ and other important parameters, namely the optimum point to synchronise the spin echo pulse sequence and the optimum angle to park the diamond for stationary Ramsey interferometry.

We can also determine whether the NV orientation class making the smallest angle to the rotation axis (hereafter simply called z', and used in all measurements in the main text) has a linear response to a small transverse magnetic field in the presence of a large z-bias field. FIG. 7b shows the NV Zeeman shift as a function of a small applied y-field in the presence of a 57 G z-bias, calculated using the numerical model and compared to a simple vectorial estimate with $\theta_{B-NV}$ the angle between the NV z' axis and $B_y$, $\theta_{B-NV} \approx 86°$. For the transverse fields used in this work ($B_y < 2$ G) the response is approximately linear.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A magnetometer for measuring a magnetic field, comprising:
   a solid state quantum system with at least two quantum spin states;
   a control signal generator to set the quantum system into a quantum state that accumulates a phase over time depending on the magnetic field;
   a detector to measure a signal from the quantum system indicative of the accumulated phase at a measurement time after setting of the quantum state; and
   a processor to determine a magnetic field measurement based on the signal measured by the detector,
   wherein the quantum system is mounted on a rotator that is configured to rotate the quantum system about a rotation axis that defines an angle with the direction of the magnetic field and at a rotation rate that modulates the magnetic field over the measurement time, and
   wherein the control signal generator and the detector are synchronised with the rotator.

2. The magnetometer of claim 1, wherein the magnetic field to be measured is static or varies slowly relative to the measurement time.

3. The magnetometer of claim 1, wherein the signal indicative of the accumulated phase is indicative of the quantum system being in one of the at least two quantum spin states as a result of the accumulated phase and a readout operation.

4. The magnetometer of claim 3, wherein the processor is configured to determine the magnetic field measurement based on multiple signals over time and based on a number of occurrences of one of the at least two quantum spin states as indicated by the multiple signals over time.

5. The magnetometer of claim 4, wherein the magnetic field measurement is a relative magnetic measurement based on a relationship between both of the number of occurrences and the magnetic field.

6. The magnetometer of claim 1, wherein the quantum state is a superposition state.

7. The magnetometer of claim 1, wherein the rotation rate is based on a coherence time of the quantum system.

8. A magnetometer for measuring a magnetic field, comprising:
   a solid state quantum system with at least two quantum spin states;
   a control signal generator to set the quantum system into a quantum state that accumulates a phase over time depending on the magnetic field;
   a detector to measure a signal from the quantum system indicative of the accumulated phase at a measurement time after setting of the quantum state; and
   a processor to determine a magnetic field measurement based on the signal measured by the detector,
   wherein the quantum system is mounted on a rotator that is configured to rotate the quantum system about a rotation axis that defines an angle with the direction of the magnetic field and at a rotation rate that modulates the magnetic field over the measurement time,
   wherein the rotation rate is based on a coherence time of the quantum system, and
   wherein the rotation rate has a period that is an integer multiple of the coherence time of the quantum system.

9. The magnetometer of claim 8, wherein the period is equal to the coherence time of the quantum system.

10. The magnetometer of claim 9, wherein the period is the decoherence time T2 of the quantum system.

11. The magnetometer of claim 1, wherein the control signal generator is configured to generate pulses to control the quantum system and the pulses are synchronised with the rotator.

12. The magnetometer of claim 11, wherein the rotator triggers the generator to generate the pulses.

13. The magnetometer of claim 11, wherein the pulses are generated at a rotation angle of the rotator such that each of the pulses is generated at the same rotation angle.

14. The magnetometer of claim 1, wherein
   an axis within the quantum system that defines at least two quantum states is parallel to a control magnetic field generated by the control signal generator and parallel to a rotation axis of the rotator; and
   the rotation axis defines a non-zero angle to the magnetic field to be measured.

15. The magnetometer of claim 1, wherein the quantum system comprises a nitrogen vacancy centre in diamond.

16. The magnetometer of claim 15, wherein the nitrogen vacancy centre in diamond has a crystal axis and the crystal axis has an angle to the rotation axis which remains constant during rotation of the quantum system.

17. The magnetometer of claim 1, wherein the quantum system comprises an ensemble of preferentially aligned nitrogen vacancies in diamond.

18. The magnetometer of claim 1, wherein the control signal generator comprises a light source to set the quantum system into one of at least two quantum states and a microwave source to set the quantum system into a superposition state that accumulates a phase over time and to control the state of the quantum system.

19. The magnetometer of claim 1, wherein the detector is configured to detect a fluorescent output signal emitted from the quantum system if the quantum system is in one of at least two quantum states.

20. A method for measuring a magnetic field, the method comprising:

generating a control signal to set a quantum system with at least two quantum states into a quantum state that accumulates a phase over time depending on the magnetic field;
measuring a signal from the quantum system indicative of the accumulated phase at a measurement time after setting of the quantum state;
determining a magnetic field measurement based on the signal, where the signal is measured by a detector; and
rotating the quantum system about a rotation axis that defines an angle with direction of the magnet field and at a rotation rate that modulates the magnetic field over the measurement time, wherein
generating the control signal and measuring the signal from the quantum system are synchronised with rotating the quantum system.

\* \* \* \* \*